(12) United States Patent
Lu et al.

(10) Patent No.: US 7,374,956 B2
(45) Date of Patent: May 20, 2008

(54) METHOD FOR IMPROVED METROLOGY BY PROTECTING PHOTORESIST PROFILES

(75) Inventors: Shyeu Sheng Lu, Hsin-Chu (TW); Hong Yuan Chu, Taichung (TW); Kuei Shun Chen, Hsin-Chu (TW); Hua Tai Lin, Yu-Kuang (TW)

(73) Assignee: Taiwan Semiconductor Manufacturing Co. Ltd, Hsin-Chu (TW)

( * ) Notice: Subject to any disclaimer, the term of this patent is extended or adjusted under 35 U.S.C. 154(b) by 96 days.

(21) Appl. No.: 10/202,956

(22) Filed: Jul. 25, 2002

(65) Prior Publication Data

US 2004/0018648 A1    Jan. 29, 2004

(51) Int. Cl.
*G01R 31/26* (2006.01)

(52) U.S. Cl. .......................................... 438/14; 438/16

(58) Field of Classification Search .................. 438/14, 438/16
See application file for complete search history.

(56) References Cited

U.S. PATENT DOCUMENTS 6,646,259 B2 * 11/2003 Chang et al. ................ 250/307
6,866,988 B2 * 3/2005 Lu et al. ...................... 430/314

* cited by examiner

*Primary Examiner*—Jack Chen

(57) ABSTRACT

A method for preserving semiconductor feature opening profiles for metrology examination including providing semiconductor wafer having a process surface comprising semiconductor feature openings; blanket depositing over the semiconductor feature openings to substantially fill the semiconductor feature openings at least one layer of material comprising silicon oxide; and, preparing a portion of the semiconductor wafer in cross sectional layout for metrology examination.

6 Claims, 1 Drawing Sheet

US 7,374,956 B2

METHOD FOR IMPROVED METROLOGY BY PROTECTING PHOTORESIST PROFILES

FIELD OF THE INVENTION

This invention generally relates to photoresist patterning and more particularly to an improved metrology method for determining dimensions of patterned semiconductor feature profiles, particularly photoresist profiles.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate photoresist interfering effects occurring in the semiconductor wafer manufacturing process.

For example, several different photoresist interfering effects may occur to form unacceptable photoresist profiles. Typically a photoresist layer is applied to a semiconductor wafer surface, for example, by spin coating a resinous layer over the process surface followed by what is referred to as a 'soft bake' to impart structural stability to the photoresist layer. The photoresist layer is then aligned and exposed to activating light through a photomask after which the photoresist undergoes a post exposure baking (PEB) process to improve adhesion and to initiate catalyzed photoresist reactions in chemically amplified photoresists, for example, deep ultraviolet (DUV) photoresists. For example in DUV photoresists the PEB process a photoacid generated during the exposure process acts to remove a protecting group from the resin thereby rendering the exposed region of the photoresist soluble in a developer. DUV photoresists, typically positive photoresists, are used for critical dimensions (CD's) of less than about 0.25 microns.

The temperature and time period of the PEB process is critical to CD control of developed photoresist profiles. Temperatures must typically be controlled to within about 0.1° C. to prevent CD variations due to undesirable photoresist chemical reactions. Another factor affecting DUV photoresist profiles is the presence of amines on the semiconductor wafer surface that tend to interfere with the acid-catalyzed reaction following exposure of the photoresist. For example, amines may be present within semiconductor wafer materials from previous processes including, for example, the CVD deposition of metal nitrides to form, for example, etching stop or bottom anti-reflectance coating (BARC) layers. As a result, the exposed photoresist region does not become fully soluble thereby resulting in altered photoresist profiles affecting CD's.

Another problem affecting photoresist profiles is the presence of reflected light from wafer process surface to form standing waves along the exposure profile resulting in light intensity exposure variation along the sidewalls of the exposed photoresist region. In addition, the development process must be properly controlled to avoid additional factors adversely affecting photoresist profiles. For example, for positive photoresists a solution typically containing tetra-methyl ammonium hydroxide (TMAH) is used as the developer. The developer may be applied by a variety of methods including spin-spray methods where the process wafer is rotated at high speeds while the developer is sprayed onto the surface. A number of factors including developer solution normality, developer temperature, and the method of applying the developer can all affect photoresist profiles.

For example, referring to FIG. 1 is shown exemplary cross sectional views of defective photoresist profiles that may be caused by improper exposure and development. For example shown in FIG. 1 is shown a series of conceptual photoresist profiles formed over substrate 10. For example, photoresist profile portion 12 represents underdevelopment of a patterned photoresist profile. Photoresist profile portion 14 represents an incompletely developed patterned photoresist profile. Photoresist profile portion 16 represents an acceptably developed patterned photoresist profile while photoresist profile portion 18 represents an overdeveloped photoresist profile.

Following development, the photoresist is subjected to a hard bake to drive off remaining solvents and achieve maximum densification of the photoresist. Following the hard bake, the process wafer is subjected to metrology inspection to identify unacceptable photoresist profiles and other exposure and development defects. In addition, the photoresist pattern is closely inspected according to various metrology tools such as microscopy to characterize the photo-patterning process in an effort to identify shortcomings in the manufacturing process which require corrective action.

There are two major popular methodologies used for the metrology of photoresist patterns including photoresist profiles. One metrology method for inspecting photoresist patterns is referred to as in-line scanning electron microscopy (SEM) where the wafer can only be examined from a top planar view thus providing little information on cross sectional profile variations. A second metrology method is referred to as off-line SEM where a representative process wafer or cross sectional portion is positioned in cross sectional view to be examined by SEM. One problem with off-line SEM is that sample preparation procedures necessary for producing a satisfactory signal from insulating materials, such as photoresist, include coating the photoresist with a conductive material, altering photoresist profiles thereby complicating the determination of the profile dimensions and determinations of whether variations are caused by the SEM sample preparation procedures or photoresist exposure and development procedures. Another problem with off-line SEM photoresist inspection is that the resolution is limited to about 50 Angstroms. For example, referring to FIG. 2 is a conceptual representation of an off-line cross sectional view of a patterned photoresist layer including typical photoresist profiles e.g., 20A patterned over substrate 20B at a typical magnification where the base portion at e.g., 20C is about 140 nm in width. With increasingly smaller critical dimensions required in semiconductor device processing such resolution is frequently not adequate to gather dimensional CD information required to optimize manufacturing processes.

There is therefore a need in the semiconductor manufacturing art to develop an improved method for patterned photoresist sample preparation and metrology including photoresist profile characterization allowing CD information to be preserved while increasing a characterization resolution.

It is therefore an object of the invention to provide an improved method for patterned photoresist sample preparation and metrology including photoresist profile characterization allowing CD information to be preserved while increasing a characterization resolution while overcoming other shortcomings of the prior art.

SUMMARY OF THE INVENTION

To achieve the foregoing and other objects, and in accordance with the purposes of the present invention, as embodied and broadly described herein, the present invention provides a method for preserving semiconductor feature opening profiles for metrology examination.

In a first embodiment, the method includes providing a semiconductor wafer having a process surface comprising semiconductor feature openings; blanket depositing over the semiconductor feature openings to substantially fill the semiconductor feature openings at least one layer of material comprising silicon oxide; and, preparing a portion of the semiconductor wafer in cross sectional layout for metrology examination.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
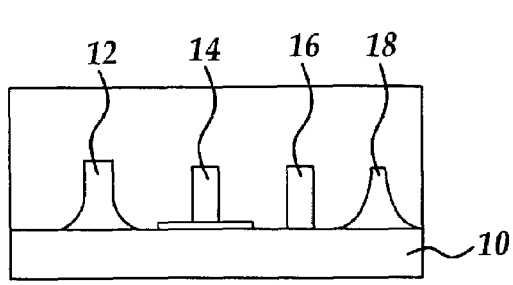
FIG. 1 is a conceptual representation of various patterned photoresist profiles indicating representative profile variations due to photoresist exposure and development processes in the prior art.
Figure 2:
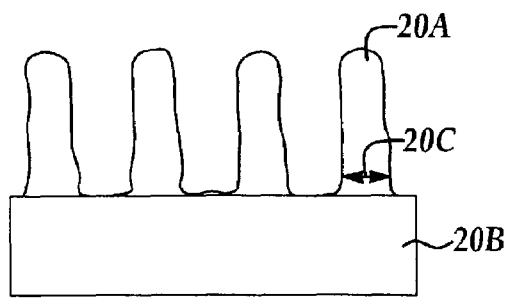
FIG. 2 is a conceptual representation of an SEM view of a typical patterned photoresist profiles indicating representative profiles and resolutions according to the prior art.

Although the present invention is explained with respect to and particularly advantageous for the formation of samples in cross sectional layout for the purpose of characterizing photoresist profiles, the method of the present invention may be used for the characterization if any insulating semiconductor feature profile including for example, vias and dual damascene structures.

In a first embodiment of the invention, a semiconductor process wafer having a process surface including a patterned photoresist layer having patterned photoresist openings is provided. A silicon oxide containing material is blanket deposited over the surface of the patterned photoresist layer to include substantially filling the patterned photoresist openings. A sample is then prepared for metrology examination, preferably transmission electron microscope (TEM) metrology where photoresist feature profiles and dimensions are characterized.

Preferably, the silicon oxide containing material is applied by a process that avoids damage to the semiconductor feature profile, for example a patterned photoresist profile. For example, a spin coating method applying a spin-on glass is one preferable process for applying the silicon oxide containing material. The SOG may include at least one of siloxanes, silicates, and silsequioxanes, for example hydrogen silsequioxane (HSQ). In one embodiment, the SOG is a silicate based SOG optionally including about 1 weight % to about 12 wt % $P_2O_5$ to improve a cracking resistance of the SOG layer. Alternatively organic groups such as methyl or phenyl are added to the SOG from about 1 weight % to about 12 weight % carbon to improve a cracking resistance. For example, carbon or phosphorus doping is particularly advantageous for SOG layers thicker than about 3000 Angstroms.

In another preferred embodiment, the silicon oxide containing layer is applied by a physical vapor deposition PVD oxide sputtering process where the process wafer surface is kept to a temperature below about 200° C. Preferably the patterned photoresist layer is subjected to either a hard bake or an ultraviolet treatment to further polymer cross linking reaction to maximize a densification and structural stability of the photoresist prior to the PVD sputtering process. For example, a hard bake at temperatures from about 130° C. to about 175° C. is carried out prior to the PVD process. For example, the sputtering system may include an RF, magnetron, or ionized PVD sputtering systems optionally including a collimator to improve step coverage.

In another embodiment, multiple silicon oxide containing layers are formed over the patterned photoresist layer to improve step coverage while reducing cracking or stress caused by shrinkage during drying the SOG. For example, a first layer of SOG is applied to a thickness of about 1000 to about 5000 Angstroms followed by a baking process at about 150° C. to about 175° C. to drive off solvents and water from the SOG film. A second layer of PVD sputtered oxide is then applied to complete the filling of the patterned photoresist features and to cap the SOG to prevent water absorption.

In another embodiment, a first layer of one of an SOG layer and a PVD silicon oxide layer is deposited over the patterned photoresist layer to a thickness of about 1000 Angstroms to about 3000 Angstroms, or about one-third to about one-half of the feature opening volume, followed by a PECVD silicon oxide process carried where the photoresist temperature is kept to less than about 200° C. to complete filling of the patterned photoresist layers. Many photoresists after being subjected to a hard baking process following development, for example at about 150° C. to complete further polymer cross linking and densification can withstand temperatures of up to about 200° C. without damage to a photoresist profile due to photoresist flowing. By first applying an SOG or a PVD sputter oxide in a lower temperature process, photoresist profiles are better preserved and protected in the PECVD deposition process being protected and fixed in place by the first deposited silicon oxide containing layer.

Figure 3A:
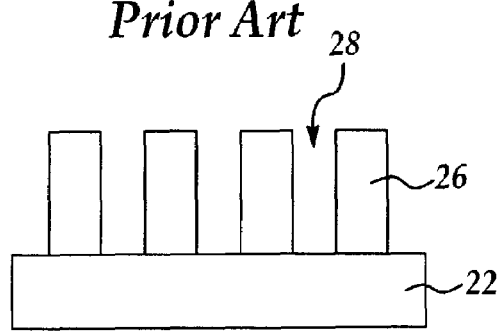
FIGS. 3A-3D are cross sectional representational views of exemplary photoresist profiles preserved for metrology according to embodiments of the present invention.

For example, referring to FIG. 3A is shown a substrate 22, for example a low-k dielectric insulating layer (IMD layer) including a BARC layer (not shown) formed over the IMD layer. Overlying the BARC layer is a patterned DUV photoresist layer e.g., 26 including developed opening patterns, e.g., 28, for example via etching patterns. It will be appreciated that the patterned photoresist layer may include a multiple layer photoresist, for example bi-layer photoresist with a silylated surface portion. For example, a silylated surface allows a depth of focus to be narrowed requiring only the exposure of a top portion of the photoresist layer followed by a silylation process as is known in the art to form a development mask over exposed portions. A dry development process is then used to develop the unsilylated portion of the photoresist. Following exposure and development, the photoresist layer 26 is preferably subjected to a hard bake up to about 175° C. and/or an ultraviolet treatment to densify the photoresist film and further polymer cross-linking reactions.

Figure 3B:
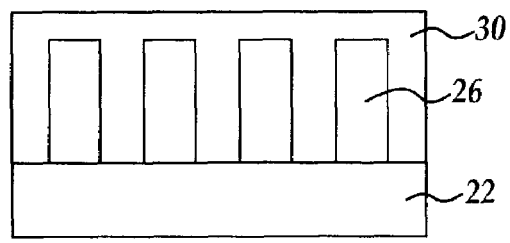

In one embodiment, referring to FIG. 3B, a silicon oxide containing material, for example SOG or PVD sputtered silicon oxide is blanket deposited over the photoresist layer 26 to include substantially filling photoresist opening patterns e.g., 28 forming silicon oxide (e.g., silicon dioxide) containing layer 30 to fix the photoresist profiles for subsequent metrology examination, preferably TEM examination. By the term 'substantially filling' is meant that the volume of the patterned openings e.g., 28 is filled to greater than about 90 percent of the opening volume. Preferably the entire volume is filled including an overlayer of deposited silicon oxide containing material.

Figure 3C:
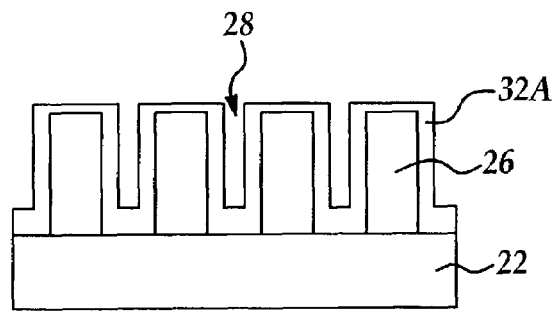
Figure 3D:
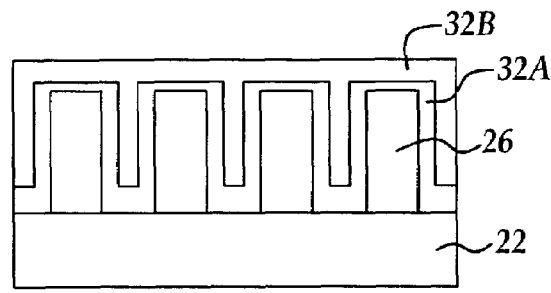

In another embodiment, referring to FIG. 3C a first layer of silicon oxide containing material 32A, for example SOG or PVD silicon oxide is blanket deposited to fill a portion of the patterned openings, e.g., 28, for example filling about one-third to about one-half the volume of the patterned opening. Referring to FIG. 3D, a second silicon oxide containing material layer 32B, for example, according to one of a SOG, PVD silicon oxide, and PECVD oxide is blanket deposited to substantially fill a remaining portion of the patterned openings, e.g., 28, to fix the photoresist profiles for subsequent metrology examination. By the use of the term 'substantially fill' it will be appreciated that while voids, for example keyholes, remaining in the substantially filled openings, are not preferable, that for metrology examination, the presence of such voids in a center portion of the patterned openings e.g., 28 is acceptable for accurate metrology of the photoresist profile and for preserving the photoresist profiles.

Following fixing of the photoresist profiles according to preferred embodiments, in another embodiment, sample portions of the process wafer including the fixed photoresist profiles are prepared for TEM examination. There are a wide variety of TEM sample preparation procedures that are known in the art. For example, TEM samples prepared in cross sectional layout with respect to the process wafer surface are prepared having a thickness of from about 100 Angstroms to about 1000 Angstrom in thickness. Various methods including finely dispersed diamond impregnated saws and ultra thin knife edges are typically used in conjunction with mechanical and/or chemical polishing and/or ion beam milling to achieve a desired sample thickness. Based on factors such as electron wavelength, accelerating voltage, and specimen thickness a resolution of about 2 Angstroms may be achieved.

Figure 4:
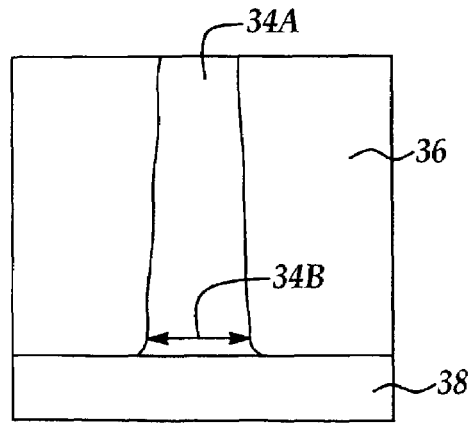
FIG. 4 is a cross sectional view of a representational TEM view of a portion of an exemplary patterned photoresist profile according to an embodiment of the present invention.

For example, referring to FIG. 4 is shown a representation of a typical TEM image of a portion of a patterned photoresist profile formed over substrate 38 preserved and fixed according to preferred embodiments of the present invention. The photoresist portion e.g., 34A has been fixed in place, for example, by depositing PVD sputter silicon oxide e.g., 36 to substantially fill the adjacent patterned photoresist feature openings. For example, the base of a photoresist column, e.g. at 34B, is about 140 nm in width. It will be appreciated higher magnifications including resolutions up to about 2 Angstroms may be obtained making photoresist profile characterization extremely accurate compared to prior art methods of in-line or off-line SEM.

Thus, according to the method of the present invention, an improved method for patterned photoresist sample preparation and metrology including photoresist profile characterization has been provided allowing critical dimensions of semiconductor features to be preserved while increasing a characterization resolution. The method according to the present invention has been found to better preserve photoresist profiles compared to prior art methods for preparing for example, off-line SEM samples including the necessity of coating with a conductive metal. It will be appreciated that the method of fixing and preserving photoresist profiles of the present invention may also be advantageously used for preparing of process wafer samples for in or off-line SEM metrology including a coating of conducting material, whereby preserving of the photoresist profiles by blanket deposition of a silicon containing material according to embodiments of the present invention also provides adequate robustness for preserving photoresist profiles during the sample preparation process for SEM metrology.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preserving semiconductor feature opening profiles for metrology examination comprising the steps of:

providing a semiconductor wafer having a process surface comprising semiconductor feature openings;

blanket depositing over the semiconductor feature openings to substantially fill the semiconductor feature openings a layer of material comprising silicon dioxide and spin-on glass (SOG); and, preparing a portion of the semiconductor wafer in cross sectional layout for metrology examination.

2. The method of claim 1, wherein the semiconductor feature openings further comprise a patterned photoresist layer.

3. The method of claim 1, wherein the step of blanket depositing comprises at least one of physical vapor deposition (PVD), spin coating, and plasma enhanced chemical vapor deposition (PECVD).

4. The method of claim 1, wherein the SOG comprises at least one of siloxanes, silicates, and silsequioxanes.

5. The method of claim 4, wherein the SOG further comprises from about 1 weight percent to about 12 weight percent of at least one of carbon and phosphorus.

6. The method of claim 1, wherein the portion of the semiconductor wafer is subjected to at least one of scanning electron microscopy and transmission electron microscopy.

* * * * *